United States Patent [19]

Baird

[11] Patent Number: 4,741,507

[45] Date of Patent: May 3, 1988

[54] SELF-CLEANING MOLD

[75] Inventor: John Baird, Scottsdale, Ariz.

[73] Assignee: Motorola Inc., Schaumburg, Ill.

[21] Appl. No.: 88,549

[22] Filed: Aug. 20, 1987

Related U.S. Application Data

[63] Continuation of Ser. No. 869,643, Jun. 2, 1986, abandoned.

[51] Int. Cl.$^4$ .............................................. B29C 45/14
[52] U.S. Cl. .................................... 249/91; 264/276; 264/272.17; 425/116
[58] Field of Search .......... 425/121, 116, 117, 129 R, 425/127, 543, 572, 125; 264/276, 272.17, 328.9; 249/91, 119; 29/588

[56] References Cited

U.S. PATENT DOCUMENTS

| | | | |
|---|---|---|---|
| 3,659,821 | 5/1972 | Sakamoto et al. | 249/96 |
| 4,252,294 | 2/1981 | Uchio | 425/572 |
| 4,368,168 | 1/1983 | Slepcevic | 264/272.15 |
| 4,374,080 | 2/1983 | Schroeder | 264/102 |
| 4,480,975 | 11/1984 | Plummer et al. | 264/276 |
| 4,504,435 | 3/1985 | Orcutt | 29/588 |

Primary Examiner—Tim Miles
Attorney, Agent, or Firm—Robert M. Handy

[57] ABSTRACT

The formation of flash during plastic encapsulation of electronic devices may be reduced or eliminated and the mold made substantially self-cleaning by modifying the mold chases so that the edges of the channels, runners, gates, and/or other locations containing plastic have a wedge shaped edge region extending to the parting plane of the mold. The wedge angle is desirably in the range 15–30 degrees, measured with respect to the parting plane. The length of the wedge should be sufficient to provide for heating of the thermosetting plastic flowing therein, with about 0.05 inches (1.3 mm) being useful for typical dual-in-line, surface mount, flat pack, or other types of semiconductor device and integrated circuit package molds. The plastic flowing into the wedges shaped region solidifies more rapidly than the plastic in the main channel, thereby damming the wedge to prevent flash formation at the mold parting line at the edges of the plastic containing regions. A method for using the mold to encapsulate electronic devices is described. Mold wear is substantially reduced.

8 Claims, 4 Drawing Sheets

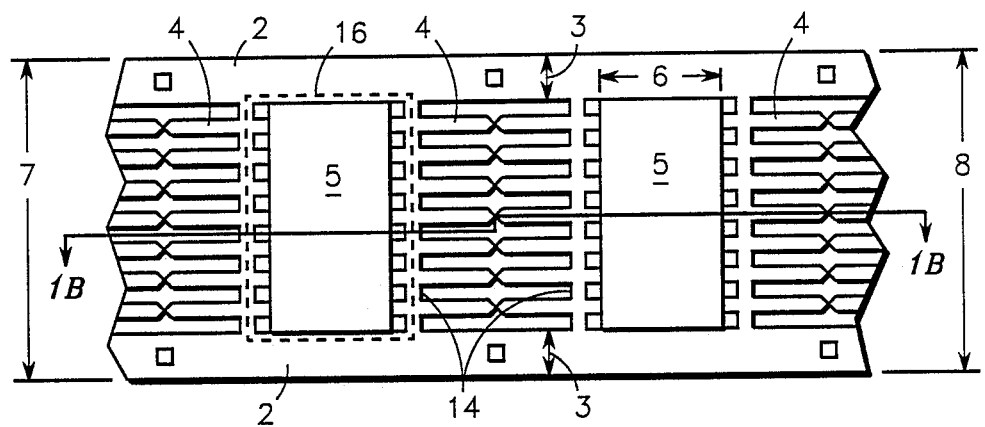
FIG. 1A —PRIOR ART—
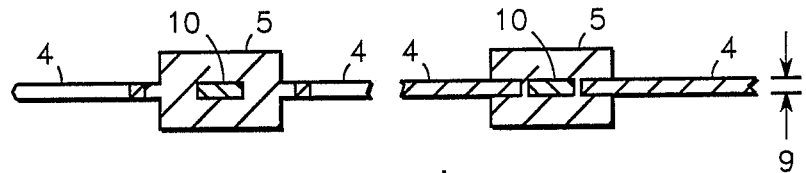
FIG. 1B —PRIOR ART—
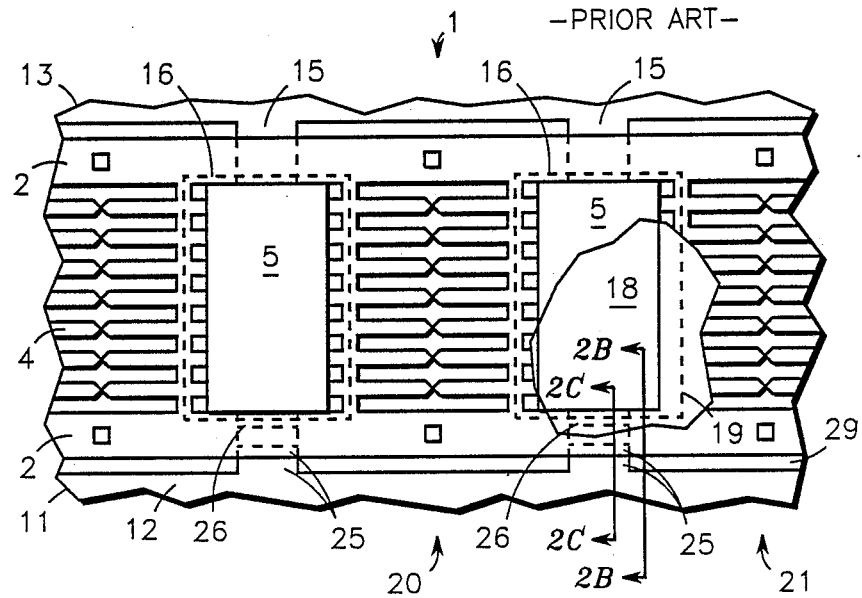
FIG. 2A —PRIOR ART—

SELF-CLEANING MOLD

This application is a continuation, of application Ser. No. 869,643, filed June 2, 1986 now abandoned.

FIELD OF THE INVENTION

This invention relates in general to means and methods for plastic encapsulation of electronic devices and, more particularly, to an improved self-cleaning mold and method of encapsulating devices therein.

BACKGROUND ART

Injection and transfer molds are commonly used for encapsulating electronic devices in plastic, especially semiconductor devices. The active element of the device is typically mounted on a leadframe which provides the external connections for the finished device. Usually, a leadframe containing many active elements is placed in a recess in one part of a separable mold. When the mold is closed, a cavity is formed surrounding each active element. The separable mold parts press tightly against the leadframe around the perimeter of each cavity in order to seal each cavity. Runners, channels, and gates connect one or more sources of plastic molding compound to each of these cavities. Plastic in liquefied form is forced into each cavity and around the active element where it hardens to form the plastic encapsulation. Thermoplastic and thermosetting plastic materials are commonly used. Type MG15F-0140 molding compound made by HYSOL Division of Dexter Industries, Olean, N.Y. is an example of a suitable thermosetting material. Suitable thermoplastic materials are well known.

A problem with such molds and molding methods is the occurrence of flash. Flash is unwanted plastic, typically in the shape of thin sheets or webs, which forms between the mold halves or mold parts, and/or on the leads, in locations where no plastic is desired. Flash is undesirable since additional effort must be expended to remove it from the leadframes after molding and to clean away fragments which may have stuck to the mold or dropped onto the mold during unloading of the leadframes. If the flash is not removed from the mold prior to the next shot, then hardened flash may cause coining of the mold and shorten its working life. This problem is most troublesome in the region of the mold chases, i.e., the portions of the mold surrounding the leadframe regions and including the sealing surfaces and various edges Thus, there is a continuing need for improved mold designs and molding methods which reduce the amount of flash which occurs during molding and which more fully insure that flash which is formed is removed along with the solidified excess plastic left (after molding) in the channels, runners, and gates which connect the plastic sources to the cavities.

Accordingly, it is an object of the present invention to provide an improved molding means and method wherein the mold is largely self-cleaning and the amount of flash remaining after removal of the solidified excess plastic is much reduced.

It is a further object of the present invention to provide an improved molding means and method wherein the substantially self-cleaning feature is suitable for use with existing molds by simple modification of their chase and channel shapes.

It is an additional object of the present invention to provide an improved molding means and method wherein the substantially self-cleaning feature is provided without requiring additional mold area.

It is a further object of the present invention to provide an improved molding means and method wherein the self-cleaning feature is suitable for use substantially everywhere it is desired to prevent plastic from encroaching between closed mold parts.

It is an additional object of the present invention to provide an improved molding means and method wherein the lateral edges of the channels, runners, and gates are self-sealing, thereby reducing the formation of flash at the edges of such features.

It is a further object of the present invention to provide an improved molding means and method which prevents plastic from extruding into narrow spaces left between the closed mold faces due to leadframe tolerance requirements.

SUMMARY OF THE INVENTION

The attainment of the foregoing and other objects and advantages is achieved through the present invention wherein the lateral sides of the channels, runners, and gates (hereafter collectively called "channels") are shaped to promote solidification of the injected plastic at the lateral edges of the channels before it can extrude into the gaps which may exist between the closed mold faces alongside these channels.

In the prior art, the channels have sides which approach the parting plane of the mold at a substantial angle, e.g., typically 70-90 degrees, measured with respect to the parting plane. A small gap, typically about a thousandth of an inch (0.025 mm), exists between the closed mold faces adjacent the channels. In the prior art, liquefied plastic enters this gap and spreads laterally creating a thin web of flash which breaks off when the mold is opened and the solidified plastic cull in the channel is removed. As used herein, the word "cull" is intended to refer to the excess plastic which solidifies in the source pot (if any) and the channels (including the runners and gates) during each mold shot and which must be removed before the next mold shot.

It has been discovered that if the edges of the channel adjacent the gap are sloped at a shallow angle (e.g., 10-50 degrees, preferably 15-30 degrees) for a sufficient lateral distance so as to form a wedge shaped region at the edges of the channel, then the plastic flowing laterally into this wedge shaped region solidifies more quickly and extrudes less or not at all into the gap.

Further, the wedge shaped plastic regions formed at the channel edges by the present invention are much stronger mechanically than the cantilevers flash arrangement produced in the prior art by the abrupt prior art transition from the thick channel cull to the thin flash. The wedge shaped region more uniformly distributes the mechanical stress applied to the edges of the solidified plastic when the mold is opened and the cull removed. Thus, even if a small amount of flash if formed at the tip of the wedge shaped edge region, it is less likely to stick, break off, and be left behind in the mold.

An improved method for encapsulating electronic devices is provided using the above described improved mold, wherein plastic is forced into the wedge shaped spaces at the lateral edges of the channels and solidified therein to avoid extrusion of substantial flash into the gap between the closed mold faces, and wherein any small flash which does form adheres less strongly to the mold and is removed integrally with the wedge shaped region formed at the edge of the solidified channel cull.

These and other features and advantages of the invention will be more fully understood in view of the drawings and detailed description which follow.

BRIEF DESCRIPTION OF THE DRAWINGS

FIG. 1A shows a top view in simplified and schematic form of a typical prior art leadframe containing plastic encapsulated electronic devices;

FIG. 1B shows cross-sectional views of the leadframe of FIG. 1A at different locations;

FIG. 2A shows the same leadframe as in FIGS. 1A-B, but lying in the lower half of a prior art plastic encapsulation mold, and with part of the leadframe and encapsulation cut away to show underlying details of the mold;

DETAILED DESCRIPTION OF THE DRAWINGS

Figure 2B:
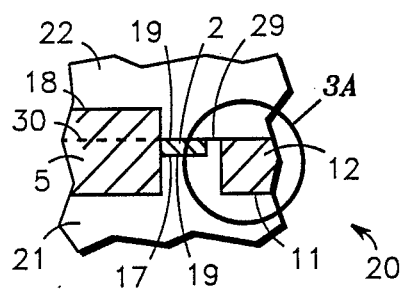
FIGS. 2B-C show partial cross-sections of the leadframe and mold of FIG. 2A, but with both mold halves in place.

FIG. 1A shows a top view and FIG. 1B shows crossectional views, both in simplified and schematic form of a typical prior art fourteen lead dual-in-line (DIL) package leadframe. Leadframe 1 contains plastic encapsulation regions 5 within which are the active elements or devices (not shown) supported on flag 10. The internal details of the active element and leadframe within plastic encapsulation regions 5 play no part in the present invention and have been omitted for clarity.

Fourteen lead DIL Leadframe 1 has width 8 of typically about one inch (25 mm) and thickness 9 of about 0.01–0.02 inches (0.25–0.51 mm), and plastic encapsulation 5 has length 7 of typically about 0.75 inches (19 mm) and width 6 of about 0.25 inches (6 mm). Leadframe 1 has longitudinal side-rails 2 of width 3 joined by tie-bars 14. Width 3 is typically about 0.12 inches (3 mm). Tie-bars 14 also connect external leads 4 which extend into plastic encapsulation 5. Leadframe 1 is adapted to have encapsulations 5 formed in a mold which seals on perimeter 16 comprising portions of rails 2, tie-bars 14 and leads 4. Such types of leadframes are well known in the art. While fourteen lead DIL leadframe 1 is used to illustrate the present invention, those of skill in the art will understand that leadframes of many sizes and shapes may be employed in connection with the present invention and that the particular leadframe illustrated in FIGS. 1A-B, 2A-B, 3A-B and 5A-B is presented merely for purposes of explanation and is not intended to be limiting. The present invention applies to any type of leadframe, including for example, DIL, flat pack and surface mount types, and having many different numbers of leads.

Figure 2C:
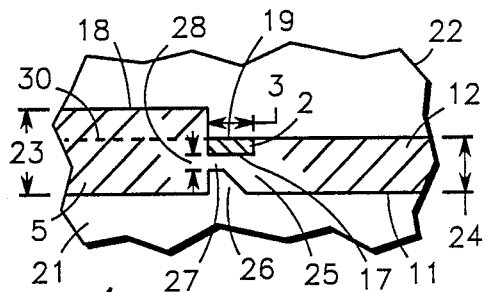

FIG. 2A shows the same leadframe as in FIG. 1A-B, but located in lower half 21 of prior art plastic injection or transfer mold 20, and with the upper half of the mold removed. Part of leadframe 1 and encapsulation 5 has been cut away to show underlying details of lower mold half 21. FIGS. 2B-C show partial cross-sections through the leadframe and mold of FIG. 2A at particular locations and with upper half 22 of mold 20 in place. Stippling is used in all figures to indicate the locations in the mold and around the leadframe where plastic is normally present. Flash is omitted from FIGS. 1A-B and 2A-B for clarity, but shown in FIGS. 3A-B and 4A-B.

Mold 20 has cavity 17 to receive leadframe 2 and cavity 18 for receiving plastic encapsulation 5. Cavity 18 has depth 23. Regions 19 of mold 20 surrounding cavity 18 in the location indicated by dotted line 16 seal against leadframe 1. These features may be particularly seen in the cut-away portion of FIG. 2A and the cross-sections of FIGS. 2B-C. Mold 20 is provided with channel 11 of depth 24 for conducting plastic 12 from a central resevoir (not shown) to the vicinity of individual cavity 18. Depth 24 is typically 0.15 inches for a fourteen lead DIL package mold, but is generally not critical. Larger or smaller depths are often used and the depth may vary for different size and shape leadframes. Channel 11 may be rectangular (open face up), as shown, or semicircular (concave facing up), or a combination thereof. The substantially rectangular or tapered rectangular shapes illustrated in FIGS. 2B-C, 3A-B, and 4A-B are merely for purposes of explanation. Semicircular or tapered rectangular shapes, wider at the top than at the bottom, are commonly used for channel 11 in order to facilitate removing the channel cull from the mold.

Extending between channel 11 and cavity 18 is runner 25 with gate 27 (see FIG. 2C). Gate 27 has an opening of height or depth 28. Gate 27 is formed by ramp-shaped protrusion 26 in runner 25. Runner 25 and gate 27 serve to conduct plastic from channel 11 into cavity 18. Gate depth 28 is typically 0.010 inches (0.25 mm). On the other side of cavity 18 from plastic inlet channel 11 is located vent channel 13 connected to cavity 18 by passage 15. Passage 15 and vent channel 13 allow the air trapped in cavity 18 when mold 20 is closed to escape so that plastic 12 may be injected into cavity 18 to form encapsulation 5.

Line 30 (FIGS. 2B-C) indicates the parting plane of mold 20 where upper half 22 separates from lower half 21. Those of skill in the art will understand that mold 20 may be composed of more than two portions, and that a two part mold is presented here merely for purposes of explanation. Multi-part molds are well known in the art.

Cross-section FIG. 2B illustrates the construction of mold 20 outside of runner 25. Dam or shelf 29 is provided between rail 2 of leadframe 1 and channel 11 to act as a barrier to prevent plastic 12 from contacting and adhering to the edges of leadframe 1.

Figure 3A:
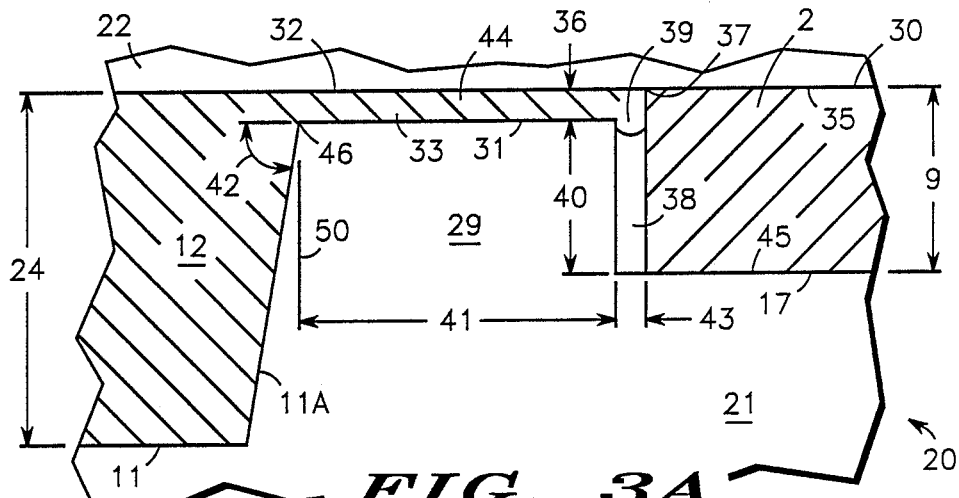
FIG. 3A shows a schematic cross-sectional view of a portion of the mold and leadframe of FIGS. 2A-B, much enlarged.

FIG. 3A shows a portion of the cross-section of FIG. 2B much enlarged. Rail 2 of leadframe 1 is located in recess 17 in lower mold half 21. Dam 29 is located between recess 17 and channel 11. In the operation of mold 20, it is essential that mold 20 seal against the upper and lower faces of leadframe 1, e.g. against upper face 35 and lower face 45 of rail 2 in recess 17. If the two mold halves do not seal tightly against leadframe 1, then the plastic injected into cavity 18 will not be contained, but will bleed out onto leads 4, rails 2, and elsewhere between the mold halves. This is particularly troublesome and to be avoided. Accordingly, depth 40 of recess 17 is chosen to be equal or less than thickness 9 of leadframe 1, including any tolerance variation which occurs in leadframe 1. Typical leadframe thickness tolerance variations are about 0.0005 inches (0.013 mm) or less. Accordingly, when mold halves 21 and 22 are closed and sealed against leadframe 1 on sealing perimeter 16, gap 44 having height 36 exists therebetween outside of sealing perimeter 16, e.g., outside of rail 2 (see FIG. 3A). Gap height 36 is generally about 0.0000-0.001 inches (0.000-0.025 mm), typically about 0.0005 inches (0.013 mm).

When plastic 12 is forced into channel 11, flash portion 33 extrudes into gap 44 between faces 32 and 33 of mold halves 22 and 21. It has been found that flash portion 33 can extend for substantial distances across dam barrier 29, often reaching corner 37 and forming portion 39 in gap 38. In a typical mold, distance 41 is about 0.05 to 0.15 inches (1.3-3.8 mm), typically about 0.1 inches (2.5 mm). Gap 38, like gap 44, arises due to the need to provide clearance between mold half 21 and leadframe 1 in the face of unavoidable dimensional variations in, for example, width 8 of leadframe 1. Width 43 of gap 38 is usually in the range 0.0000-0.003 inches (0.0000-0.075 mm) with 0.0015 inches (0.038 mm) being typical.

Figure 3B:
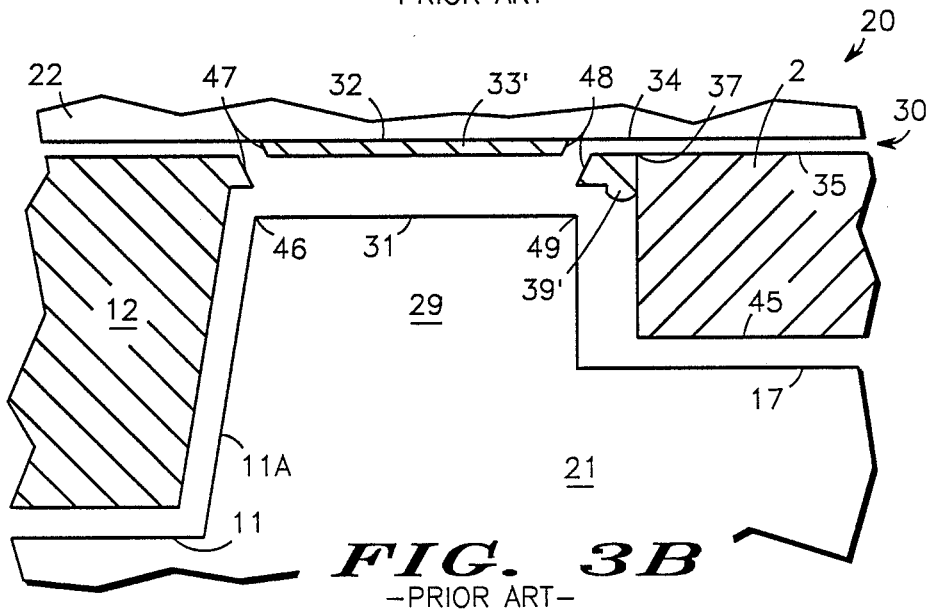
FIG. 3B shows a view of the same portion as in FIG. 3B but with the mold opened and the channel cull and leadframe partially removed.

FIG. 3B shows what happens when the prior art arrangement of mold 20, depicted in FIG. 3A, is opened at parting plane 30 and plastic cull 12 and leadframe 2 removed. The length to thickness ratio of flash portion 33, i.e., lengths 41 plus 43 divided by thickness 36, is typically about 200/1 or larger. It has the shape of a cantilevered flange extending from sharp corner 46. Accordingly, flash portion 33 is easily broken away from plastic cull 12. Further, because lateral distance 41 is substantial flash portion 33 is likely to adhere strongly to surface 31 or 32 of mold 20, breaking away, for example, from cull 20 at location 47 and from fragment 39 at location 48. This behavior is facilitated by the presence of sharp corners 46 and 49, and relatively steep angle 42, typically 70-90 degrees, which sidewall 11A of channel 11 makes to parting plane 30. Accordingly, the result is typically as depicted in FIG. 3B with portion 33' remaining on one face or the other of mold 20 and fragment 39' adhering to side-rail 2. Fragments 33' and 39' must then be cleaned away from the mold and leadframe, usually by wire brushing or the like, thereby adding to the cost of the process and finished parts. Additionally, most molding compounds used for electronic devices contain highly abrasive filler materials (e.g., powdered quartz and/or alumina), so that significant mold wear occurs when the fragments are brushed away. The grinding action of the abrasive molding materials and the mold coining that can result from any fragments left behind, shorten mold life and increase molding costs.

Figure 4A:
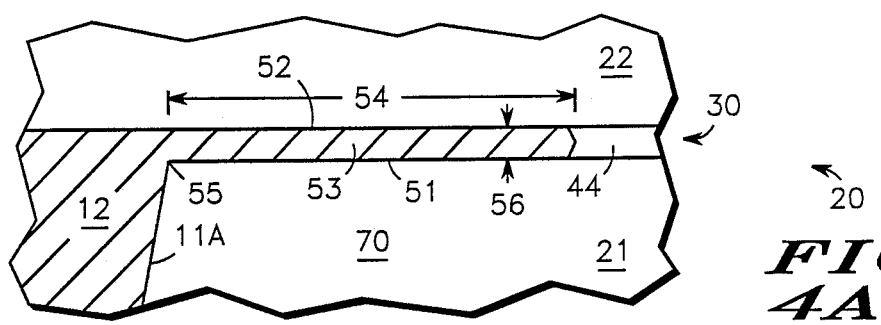
FIG. 4A-B show views similar to those of FIGS. 3A-B but at another location in the mold where there is no nearby leadframe portion.
Figure 4B:
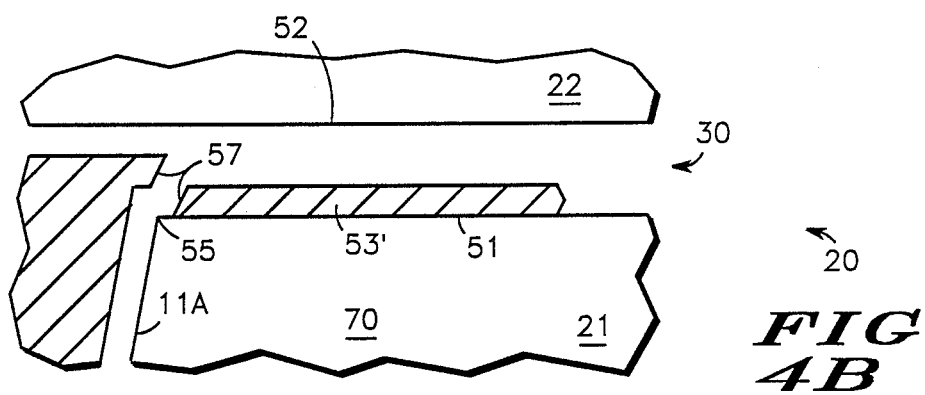

FIGS. 4A-B illustrate a similar problem which occurs in other areas of the mold remote from leadframe 1, e.g., along the sides of channel 11 leading up to the location of leadframe 1. In FIGS. 4A-B, gap 44 exists for the same reasons as in FIGS. 3A-B, but side-rail 2 is remote. Plastic flash portion 53 extrudes into gap 44 of width 56 between faces 51 and 52 of mold halves 21 and 22 for a distance 54 over dam or shelf portion 70. The length to thickness ratio, i.e., length 54 divided by thickness 56, of plastic flash portion 53 is also typically about 200/1 or larger. Sharp corner 55 at the intersection of channel side 11A and top surface 51 of dam portion 70 has the same effect as corner 46 of FIG. 3A. When mold halves 21 and 22 are separated at parting plane 30, as shown in FIG. 4B, flash portion 53' breaks off, for example at 57, and adheres to surface 51 or 52 creating the same problem as discussed in connection with FIGS. 3A-B.

Figure 5A:
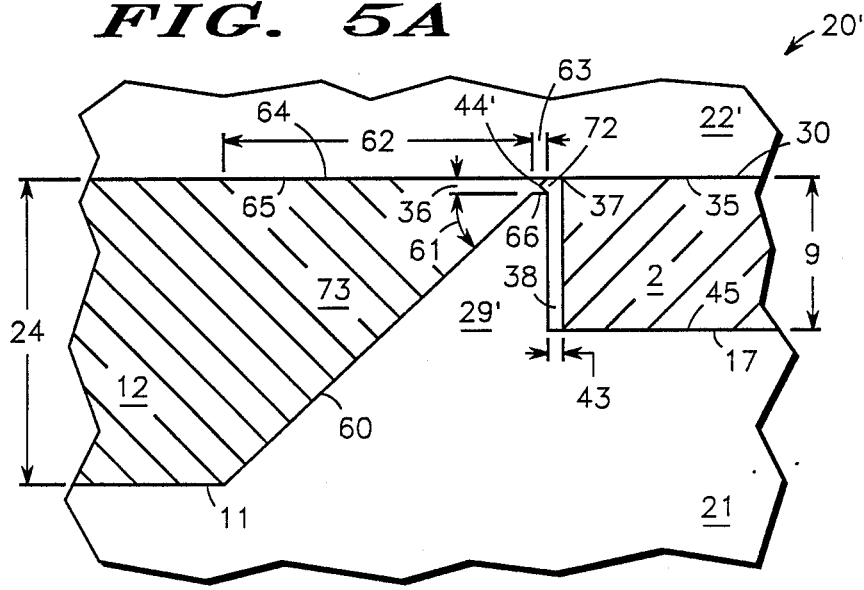
FIG. 5A shows a schematic cross-sectional view similar to that of FIG. 3A but according to the present invention.
Figure 5B:
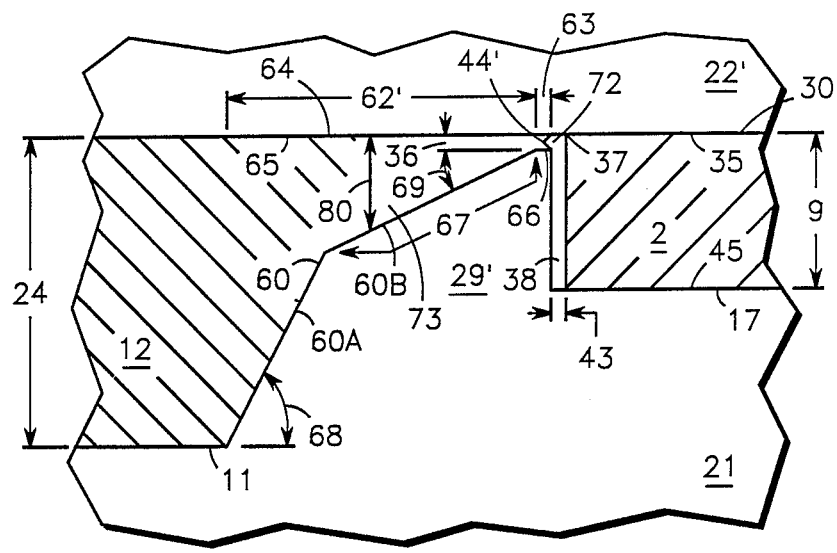
FIG. 5B shows a view similar to that of FIG. 5A but according to a further embodiment of the present invention.
Figure 6:
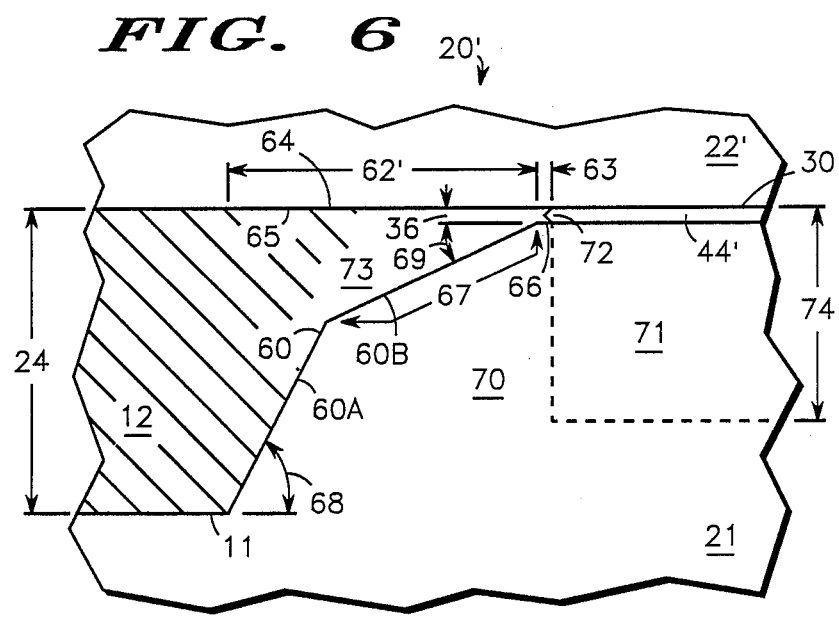
FIG. 6 shows a schematic cross-sectional view similar to that of FIG. 4A but according to a further embodiment of the present invention.

The problems illustrated in FIGS. 3A-B and 4A-B and the like may be avoided with the arrangement of the present invention shown in FIGS. 5A-B and 6. FIGS. 5A-B are cross-sections similar to those shown in FIGS. 3A-B and FIG. 6 corresponds to the situation shown in FIGS. 4A-B, except that the formation of flash is inhibited and if some flash does form it is removable integrally with cull 12.

FIGS. 5A is identical to FIG. 3A except that improved dam or shelf means 29' has been modified compared to prior art dam 29 so that (i) sidewall 60 of channel 11 slopes toward gap 44' at comparatively small angle 61 and (ii) width 63 of top or ridge portion 66 of dam 29 is made as small as possible. This provides wedged shaped region 73 into which the plastic must flow before reaching gap 44'. It has been found that when this arrangement is used, leading edge 72 of plastic wedge region 73 freezes into immobility without substantially penetrating through gap 44' or into gap 38. The shape of improved dam 29' creates a barrier to plastic flow into gaps 44' and 38. Thus, little if any flash is formed in gaps 44' and 38.

Even if some flash does extend into gap 44', it is connected to cull 12 by comparatively thick wedge 73 as opposed to thin web 33 and has a much smaller length to thickness ratio, i.e., length 63 divided by thickness 36. When improved mold 20' is opened along parting plane 30 and cull 12 removed, wedge 73 and tip 72 generally come free as one piece. Even though length 62 may be the same or larger than length 41 in the prior art arrangement, there is less tendency for wedge region 73 to break off and stick to surfaces 64 or 60 of mold halves 22' and 21', respectively. The wedge shape of region 73 provides sufficient mechanical strength so that the plastic may be pulled away from surfaces 60 and 64 without fracturing region 73 from cull 12. Thus, improved mold 20' utilizing wedge shaped region 73 is substantially self-cleaning.

Angle 61 is usefully in the range 10-50 degrees, measured with respect to parting plane 30, conveniently 10-40 degrees, with about 15-30 degrees being preferable. Width 63 of top or ridge portion 66 of improved dam 29' is desirably made as small as possible. Top portion 66 should ideally be a knife edge. However, a knife edge is easily damaged, so it is desirable that ridge portion 66 be flat or slightly rounded at the point of closest approach of dam 29' to upper mold half 22'. Portion 66 has length 63. Length 63 is desirably such that the ratio of length 63 to gap width or thickness 36 is less than about 20, preferably 10 or less. For the typical dimensions provided in the above examples where gap width 36 is 0.0000 to 0.001 inches (0.0 to 0.025 mm), then length 63 is desirably about 0.02 inches (0.5 mm), preferably about 0.010 inches (0.25 mm) or less. For the example leadframe and mold shown, length 63 is about one-fifth to one-tenth or less of the distance 62 or 62' from ridge portion 66 to the bottom of channel 11.

FIG. 5B shows a cross-sectional view similar to FIG. 5A but according to a further embodiment of the present invention. In FIG. 5B, side-wall 60 of channel 11 has been broken into two portions 60A and 60B making angles 68 and 69, respectively to planes parallel to parting plane 30. Angles 68 and 69 total ninety degrees. Angle 69 performs the same function as angle 61 of FIG. 5A and the same ranges apply. For a fixed separation 62' between channel 11 and gap 44' (or recess 17), the arrangement of FIG. 5B makes it possible to use a smaller value for angle 69 than would be possible with the arrangement of FIG. 5A. Conversely, for a given angle 69, wedge shaped region 73 may be provided in a shorter distance 62' by making angle 68 larger than angle 69.

With the arrangement of FIG. 5B it is important that distance 67 be sufficiently long to allow time for the plastic flowing into wedge shaped region 73 to change temperature sufficiently to promote rapid solidification of the plastic. With thermoplastic materials the mold is kept colder than the injected plastic and with thermosetting materials the mold is generally kept hotter than the injected plastic. Thus, the injected plastic is heated or cooled by the mold walls, according to what type of material is being used and the corresponding mold temperatures. The flash preventing action of the present invention does not require that the plastic flowing into wedge shaped region 73 become completely rigid before flash inhibition results. The temperature change need only be sufficient to initiate the transition from liquid to solid, so that the plastic material flowing into wedge shaped region 73 is increasingly viscous and granular or doughy. The wedge shape of region 73 causes the increasingly viscous plastic material to self-dam. As the plastic material flows into wedge shaped region 73 the local pressure rises very rapidly, e.g., inversely proportional to the third power of height 80 of wedge shaped region 73. Thus, with thermosetting materials where the walls of the wedge are hot, as the wedge becomes narrower and narrower closer to gap 44' and height 80 decreases, the rapidly rising pressure can accelerate the heating and solidification action of the thermosetting materials. With thermoplastic materials, the walls of the wedge are cold and the plastic cools more rapidly as it penetrates further into the cold walled wedge since the surface to volume ratio of the plastic material in the wedge is increasing. Thus, for either type of molding compound, as the remaining space narrows, the material begins to solidify and particles of the increasingly viscous and granular plastic eventually form a bridge or dam braced against the narrowing walls of the wedge which stops further flow.

With the wedge shaped arrangement of the present invention, this damming of the approach to gap 44' occurs even while the plastic in channel 11 is still fluid. The self-damming action of the present invention does not occur in the prior art arrangements of FIGS. 3A and 4A where gap 44 has a constant (or increasing) width. With the arrangement of the prior art, the plastic in gap 44 can continue to slide to the right even though it is becoming increasingly solid, until the material in channel 11 itself begins to solidify at corner 46 and no more enters gap 44. For the typical DIL leadframe and mold shown in FIGS. 5B and 6, length 67 is conveniently at least 0.04 inches (1 mm), preferably about 0.05 inches (1.3 mm) or larger. Similar dimensions are suitable for leadframes and molds having about the same leadframe thickness tolerance variations (and hence about the same gap sizes), irrespective of the number of leads on the leadframe. Other lengths may be required for other molds and gaps. These can be readily determined by those of skill in the art based on the teachings herein.

FIG. 6 shows a cross-section similar to that of FIG. 5B, but adapted to deal with the situation illustrated in FIG. 4A, that is, where there is no nearby leadframe. The same wedge shaped region 73 is provided in FIG. 6 as in FIGS. 5A or 5B, and for the reasons explained above, the same self-damming action results. Since the plastic only penetrates substantially to the end of wedge shaped region 73, the portion of mold 20' to the right of this point may be left unchanged, as indicated by the solid line, or may be relieved by including recess 71 of depth 74, as indicated by the dotted line in FIG. 6.

It will be appreciated by those of skill in the art that when improved mold 20' is opened along parting plane 30, that solidified plastic cull 12 and solidified wedge shaped plastic region 73 will substantially release from mold 20' as a unit, and any fragments which do break off will be small and either lying loose in the mold or not strongly adhering thereto so that they may be easily removed by an air blast. The prior art problem wherein substantial fragments of thin flash stick tenaciously to the mold surface and from which they can only be removed by vigorous wire brushing does not occur because of the improved mechanical strength of the wedge shaped edge of the plastic cull and the reduction in flash due to the self-damming action of this invention.

Plastic encapsulated electronic devices may be more readily and inexpensively manufactured by using a mold having the above-described improved shape. Devices mounted on leadframes are placed in recesses in the mold, the mold closed and plastic injected or transferred from reservoirs into the mold cavities around the devices. After the appropriate curing times, the mold is opened and the culls and flash if any removed as a unit and the mold halves blown clean. The process is then repeated.

The above described invention provides an improved means and method for encapsulation of electronic devices wherein the occurrence of flash is reduced or eliminated and flash which does form at the borders of the mold channels and the like is substantially removable integrally with the channel culls.

Those of skill in the art will further appreciate that many variations may be made and different molds and leadframe arrangements used without departing from the spirit and teachings of this invention. For example, the illustrations given herein show an arrangement in which the leadframe cavity, the lower half of the device cavity, and the channels (including runners and gates) are in the lower mold half, while the upper mold half contains only the upper half of the device cavity. Those of skill in the art will appreciate that the leadframe cavity, device cavity, and channels, runners, and/or gates may be located in either or both mold halves, or for a multi-part mold, in the same or other locations.

Those of skill in the art will also appreciate that the wedge shaped regions at the edges of the channels may be provided (as illustrated) entirely on one mold half, or may be split between two or more mold parts. For example, FIGS. 5A-B and 6 show an arrangement where wedge angles 61, 69, and 68 are entirely located in the lower mold half while the opposing upper mold half has a flat surface. The same sealing action could be obtained by placing the wedge in the upper mold half or partly in both halves. For example, wedge angles 61 and 69 could be in the range 5–25 degrees in lower mold half 21' while the upper mold half contains a similar wedge of 5–25 degrees, so that the total wedge angle is 10–50 degrees. Different proportions of the wedge can be in either mold half. Those of skill in the art will understand that many variations can be made in the placement of the wedge between the separable mold parts without departing from the teachings herein.

The principles taught herein apply wherever there is a gap or potential gap, at a mold parting plane or around a leadframe, which communicates with a location in the mold containing plastic. The gap may arise due to leadframe tolerance variations or due to mold distortion or due to errors or tolerances in mold fabrication or due to a combination thereof or due to other causes. The principles described herein may be used to reduce or prevent flash irrespective of the cause of the gap.

Accordingly, it is intended to include these and other variations within the claims which follow.

I claim:

1. A mold for receiving electronic components mounted on a leadframe having a first thickness, for encapsulation in a plastic comprising a premixed filler and resin, comprising:
    first and second mold halves which separate along a parting plane and have opposed surfaces facing said parting plane and wherein parts of said opposed surfaces of said mold are nominally closed together or on said leadframe when said mold halves are engaged;
    a cavity in either or both of said mold halves extending to said parting plane for receiving said leadframe;
    channel means in either or both of said mold halves, extending to said parting plane, for conducting said plastic to the vicinity of said cavity, wherein said channel means is laterally separated from said cavity or said nominally closed portions of said mold by a first distance, and wherein said channel has a bottom portion displaced from said parting plane;
    shelf means in said mold, wherein said shelf means is located adjacent said cavity or said nominally closed portion of said mold and extends substantially to said channel means for separating said cavity or said nominally closed portion of said mold and said channel means for preventing flow of said plastic from said channel means toward said cavity or said nominally closed portions of said mold;
    wherein said shelf means has an outer first surface facing an outer second surface of an opposing mold half;
    wherein said first surface has a first portion adjacent said cavity or said nominally portion of said mold and facing a first portion of said second surface, and a second portion adjacent said first portion and facing a second portion of said second surface;
    wherein said second portion of said first surface extends from said first portion of said first surface to said channel bottom, and wherein said second portion of said first surface extends at least partly toward said bottom of said channel at an angle of 10 to 50 degrees; and
    wherein said angle is measured in a plane perpendicular to said parting plane and between said second portions of said first and second surfaces.

2. The mold of claim 1 wherein said angle is from 10 to 40 degrees.

3. The mold of claim 1 wherein said angle is from 15 to 30 degrees.

4. The mold of claim 1 wherein said first portion of said upper surface has a width measured in the same direction as said first distance of less than one-fifth of said first distance.

5. The mold of claim 1 wherein said first portion of said upper surface has a width measured in the same direction as said first distance of less than one-tenth of said first distance.

6. A mold having opposing surfaces separable at a partying plane for encapsulating leadframe mounted electronic devices in a plastic comprising at least a premixed filler and resin, comprising:
    multiple cavity means for receiving said leadframe located in said mold and extending to said parting plane;
    channel means in said mold for carrying said plastic from at least one reservoir to said multiple cavity means, where said channel means has a bottom portion and sidewall portions, and wherein said sidewall portions extend substantially from said bottom portion to said parting plane;
    barrier means along at least part of said channel means for laterally separating, by a first distance, mold portions outside said channel means from said bottom portion of said channel means;
    wherein said barrier means has a first portion adjacent said mold portions outside said channel means extending from said mold portions outside said channel means toward said channel means by less than about 0.2 inches (0.5 mm), wherein said first portion is located adjacent said parting plane; and
    wherein said barrier means has a second portion formed by at least one sidewall of said channel means, and wherein said at least one sidewall slopes from said first portion toward said bottom portion of said channel means by an angle, with respect to the opposing mold surface in the range of about 10 to 50 degrees.

7. The mold of claim 6 wherein said at least one sidewall has a first part adjacent said first portion of said barrier means which slopes away from said opposing surface by a first angle of between 10 and 40 degrees, and a second part extending from said first part to substantially said bottom of said channel means.

8. The mold of claim 6 wherein said at least one sidewall has a first part adjacent said first portion of said barrier means which slopes away from said opposing surface by a first angle of between 15 and 30 degrees, and a second part extending from said first part to substantially said bottom of said channel means.

* * * * *